(12) United States Patent
Hilbers et al.

(10) Patent No.: US 8,704,104 B2
(45) Date of Patent: Apr. 22, 2014

(54) ELECTRICAL CONNECTOR, ELECTRICAL CONNECTION SYSTEM AND LITHOGRAPHIC APPARATUS

(75) Inventors: Alexander Petrus Hilbers, Velsen-Noord (NL); Ronald Van Der Wilk, Knegsel (NL)

(73) Assignee: ASML Netherlands B.V., Veldhoven (NL)

( * ) Notice: Subject to any disclaimer, the term of this patent is extended or adjusted under 35 U.S.C. 154(b) by 97 days.

(21) Appl. No.: 13/178,369

(22) Filed: Jul. 7, 2011

(65) Prior Publication Data
US 2012/0024585 A1 Feb. 2, 2012

Related U.S. Application Data

(60) Provisional application No. 61/365,554, filed on Jul. 19, 2010.

(51) Int. Cl.
*H05K 1/11* (2006.01)
(52) U.S. Cl.
USPC ............ 174/261; 174/250; 174/262; 361/794
(58) Field of Classification Search
USPC .................... 174/260–262; 361/794
See application file for complete search history.

(56) References Cited

U.S. PATENT DOCUMENTS

| | | | |
|---|---|---|---|
| 6,255,601 B1 | 7/2001 | Burkhart | |
| 7,091,424 B2* | 8/2006 | Oggioni et al. | 174/262 |
| 7,294,791 B2* | 11/2007 | Danoski et al. | 174/261 |
| 7,615,708 B2* | 11/2009 | Hsu et al. | 174/262 |
| 2003/0063453 A1* | 4/2003 | Kusagaya et al. | 361/794 |
| 2009/0290317 A1* | 11/2009 | Mashino | 361/782 |
| 2011/0214912 A1* | 9/2011 | Lin | 174/260 |

FOREIGN PATENT DOCUMENTS

DE 102008030339 A1 * 12/2009
JP 2006-244862 A 9/2006

* cited by examiner

*Primary Examiner* — Hoa C Nguyen
*Assistant Examiner* — Amol Patel
(74) *Attorney, Agent, or Firm* — Sterne, Kessler, Goldstein & Fox P.L.L.C

(57) ABSTRACT

An electrical connector comprises a high voltage pad and a high voltage plate. When connected to another electrical connector, the two plates, which are at the same voltage as the pads, form a region of high voltage in which the field is low. The pads are positioned in that region. An electrostatic clamp of an EUV lithographic apparatus may have such a pad and plate, for connecting to the electrical connector. By placing the interconnection in a low field region, triple points (points of contact between a conductor, a solid insulator and a gas) may be present in that region.

8 Claims, 12 Drawing Sheets

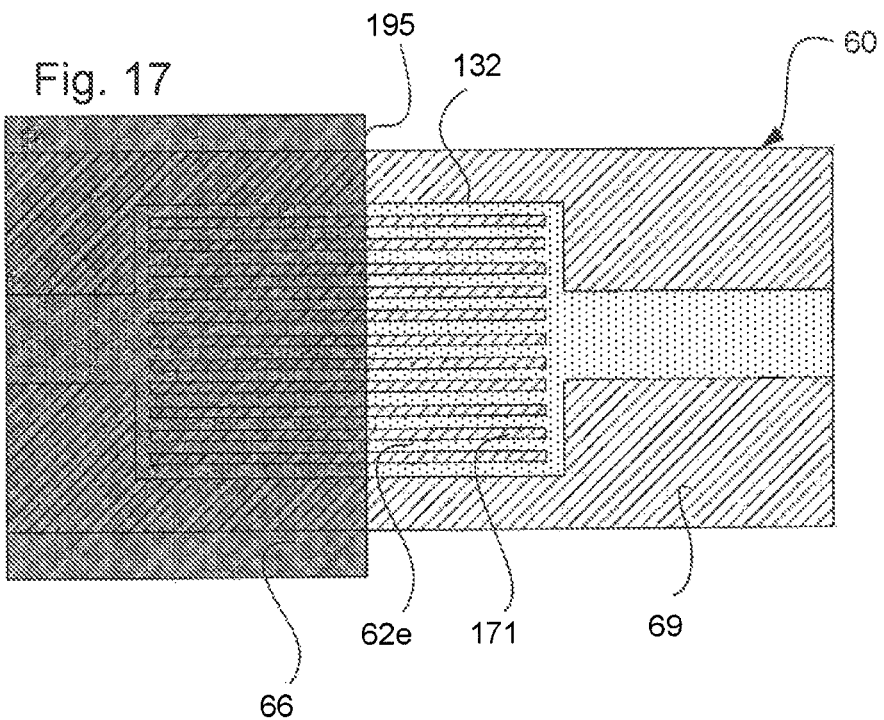
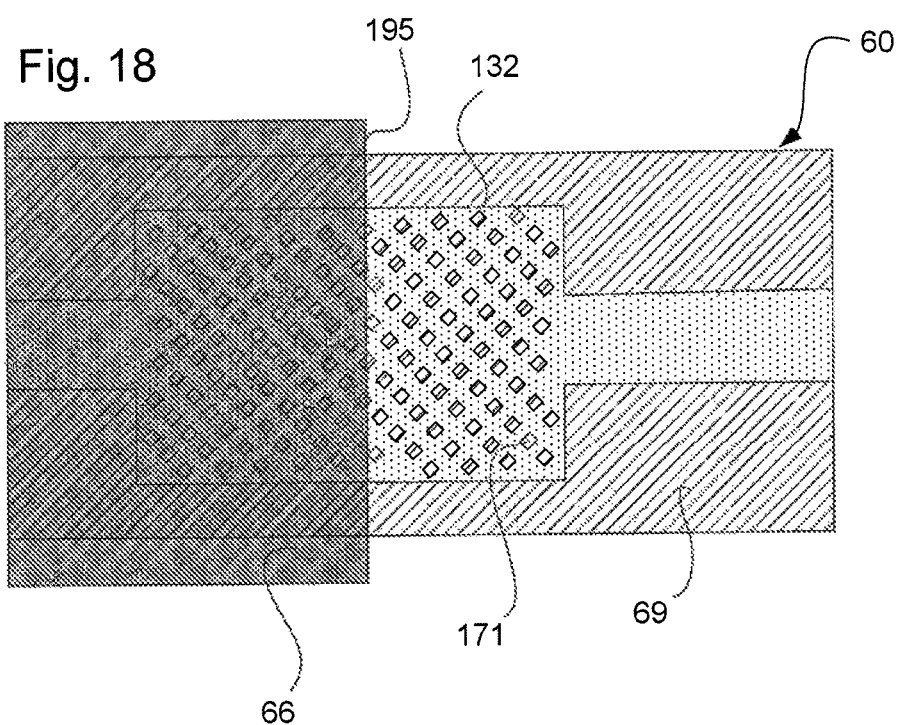

ELECTRICAL CONNECTOR, ELECTRICAL CONNECTION SYSTEM AND LITHOGRAPHIC APPARATUS

CROSS REFERENCE TO RELATED APPLICATIONS

This applications claims benefit under 35 U.S.C. 119(e) to U.S. Provisional patent Application No. 61/365,554, filed, Jul. 19, 2010, which is incorporated by reference herein in its entirety.

BACKGROUND OF THE INVENTION

1. Field of the Invention

Embodiments of the present invention relate to a high voltage electrical connector, a high voltage electrical connection system and a lithographic apparatus.

2. Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from a patterning device to the substrate by imprinting the pattern onto the substrate.

A component of the lithography apparatus is powered by a high voltage power supply. An electrical connector and an electrical connection system are needed that can withstand such high voltage. Furthermore, the component must be able to withstand the high voltage. In a lithographic apparatus, a high voltage power supply may be used to power an actuator, a blade or a clamp, for example. An actuator may be used to position the table on which the substrate is placed. An actuator may power a blade that is configured to block a portion of the projection beam. Clamps hold the mask or the substrate to a table. One example of a clamp is an electrostatic clamp, which includes electrodes that are connected to a power supply.

Additionally, for applications other than in lithographic apparatuses, it is desirable to have an electrical connector and an electrical connection system that can withstand high voltage. Electrical breakdown at high voltage can at least cause damage to, and often destroy, electrical components. Electrical breakdown poses a health risk. In particular, electrical breakdown is an increased risk at points of wiring or components that are at high voltage and are at least partially exposed to gas. This may be the case at the terminal of wiring or of a component, for example.

If a breakdown occurs, it can damage optical surfaces, create electromagnetic interference that disturbs sensitive electronics and present a human safety hazard. Electrical discharge may cause deterioration of any insulation material of an electrical power line. This may reduce the lifetime of the electrical power line. Electrical discharge may give rise to unwanted effects such as electromagnetic interference. Such electromagnetic interference may have a negative influence on electronic circuits and/or may violate legislation of industry standards.

It is desirable to provide an electrical connector, an electrical connection system and a lithographic apparatus with an electrical component that can withstand high voltages.

BRIEF SUMMARY OF THE INVENTION

According to an aspect of the present invention, there is provided a high voltage electrical connector comprising a laminate that comprises, in order, the following layers:
  an outer shield layer;
  an outer insulating layer;
  a high voltage plate;
  an inner insulating layer; and
  a high voltage supply pad;
wherein the pad is smaller than the plate and lies substantially wholly within the plate when viewed in a direction perpendicular to a plane of the laminate.

According to a further aspect of the present invention, there is provided a lithographic apparatus arranged to transfer a pattern onto a substrate comprising:
  an electrostatic clamp configured to clamp a substrate to a structure, the clamp comprising:
    a high voltage receipt pad configured to electrically connect to a component external to the clamp; and
    a high voltage plate substantially parallel to the pad;
  wherein the pad is smaller than the plate and lies substantially wholly within the plate when viewed in a direction perpendicular to a plane of the plate.

According to a further aspect of the present invention, there is provided a high voltage electrical connection system comprising:
  a high voltage supplying electrical connector having a high voltage supply pad; and
  a high voltage receiving electrical component having a high voltage receipt pad in electrical connection with the supply pad;
wherein a perimeter of both the supply pad and the receipt pad are positioned in a region that is substantially an equipotential when the supply pad and the receipt pad are at high voltage.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein

BRIEF DESCRIPTION OF THE DRAWINGS/FIGURES

Embodiments of different aspects of the present invention will now be described, by way of example only, with reference to the accompanying schematic drawings, in which corresponding reference symbols indicate corresponding parts, wherein:

FIG. 17 depicts in plan view an electrical connector 60 according to an embodiment;

FIG. 18 depicts in plan view an electrical connector 60 according to an embodiment;

DETAILED DESCRIPTION OF THE INVENTION

Figure 1:
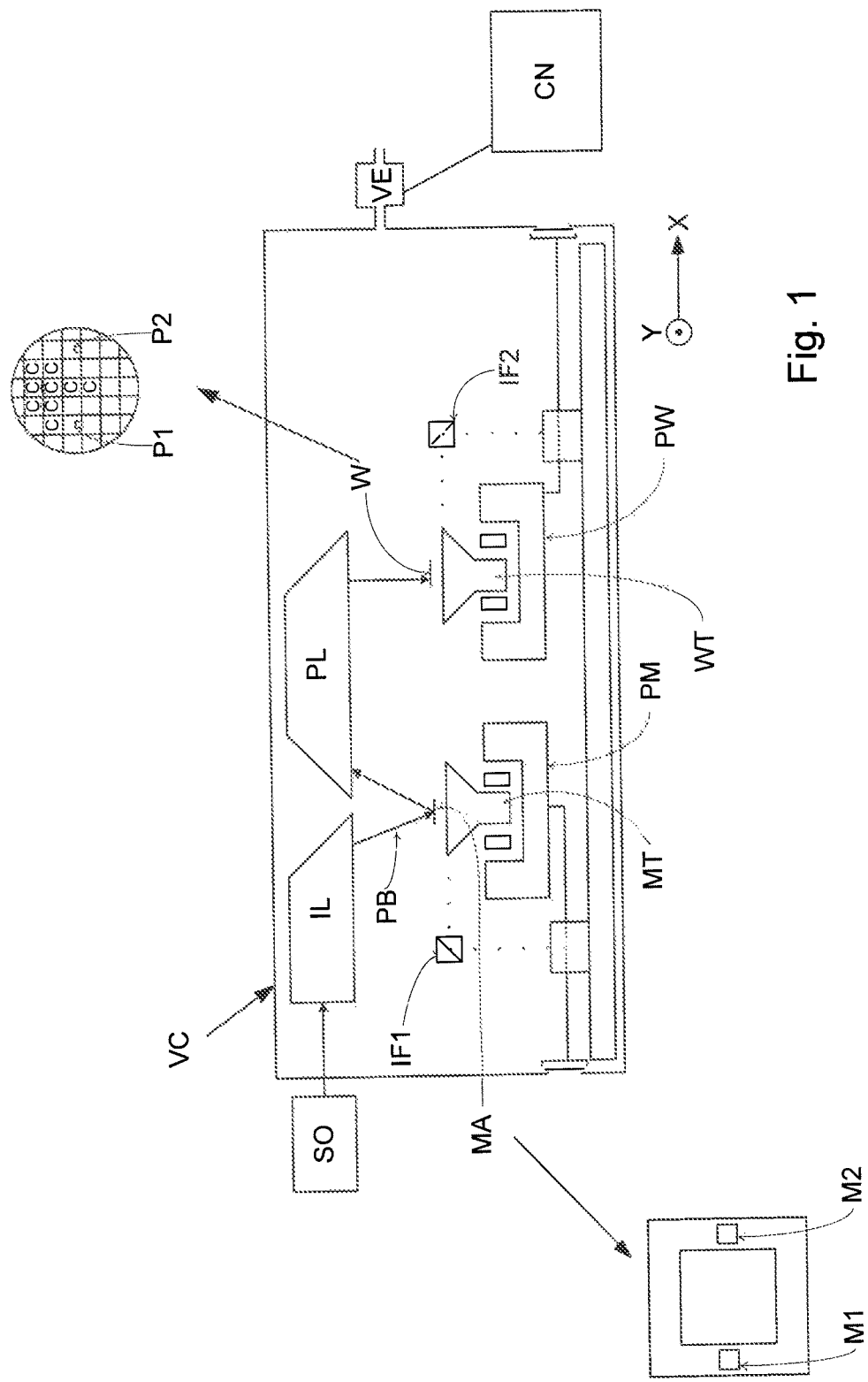
FIG. 1 depicts a lithographic apparatus according to an embodiment of the invention.

FIG. 1 schematically depicts a lithographic apparatus according to one embodiment of the invention. The apparatus includes:

an illumination system (illuminator) IL configured to condition a radiation beam B (e.g., UV radiation or EUV radiation);

a support structure (e.g., a mask table) MT constructed to support a patterning device (e.g., a mask) MA and connected to a first positioner PM configured to accurately position the patterning device in accordance with certain parameters;

a substrate table (e.g., a wafer table) WT constructed to hold a substrate (e.g., a resist-coated wafer) W and connected to a second positioner PW configured to accurately position the substrate in accordance with certain parameters; and a projection system (e.g., a refractive projection lens system) PS configured to project a pattern imparted to radiation beam B by patterning device MA onto a target portion C (e.g., including one or more dies) of substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is—reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system-".

As here depicted, the apparatus is of a reflective type (e.g., employing a reflective mask). Alternatively, the apparatus may be of a transmissive type (e.g., employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from source SO to illuminator IL with the aid of a beam delivery system BD including, for example, suitable directing mirrors and/or a beam expander. In other cases the source may be an integral part of the lithographic apparatus, for example when the source is a mercury lamp. Source SO and illuminator IL, together with beam delivery system BD if required, may be referred to as a radiation system.

Illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, illuminator IL may include various other components, such as an integrator IN and a condenser CO. The illuminator may be used to condition the radiation beam, to have a desired uniformity and intensity distribution in its cross-section.

A masking device, which defines the area on the patterning means that is illuminated, may be included in illuminator IL. The masking device may include a plurality of blades, for example four, whose positions are controllable, e.g., by actuators such as stepper motors, so that the cross-section of the beam may be defined. It should be noted that the masking device need not be positioned proximate the patterning means but in general will be located in a plane that is imaged onto the patterning means (a conjugate plane of the patterning means). The open area of the masking means defines the area on the patterning means that is illuminated but may not be exactly the same as that area, e.g., if the intervening optics have a magnification different than 1.

Figure 8:
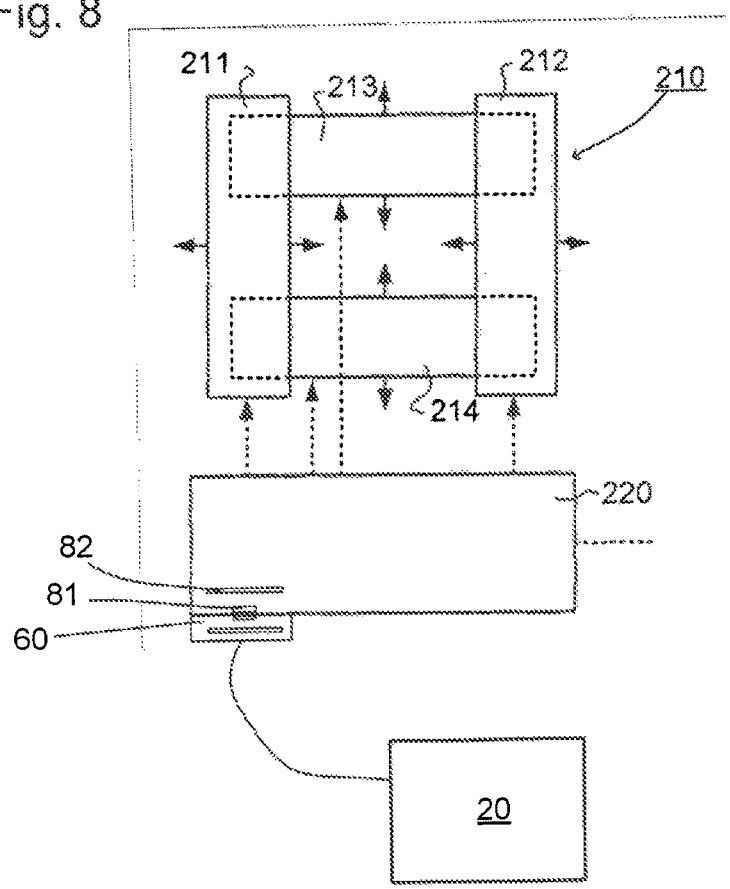
FIG. 8 depicts a beam interceptor connected to a power supply according to an embodiment of the invention.

According to an embodiment of the invention, the masking device includes a beam interceptor 210, including opaque blades 211, 212, 213, 214 that are arranged to intercept part of radiation beam B, as is shown in FIG. 8. Blades 211, 212, 213, 214 manipulate the size and shape of the exposed projection beam B on mask MA and accordingly on target portions C. The movement and positioning of blades 211, 212, 213, 214 is controlled by a control system 220. It a projected target portion C is not fully positioned on substrate W, control system 220 is arranged to define a new size for this particular target portion C and actuate beam interceptor 210 accordingly.

The patterning device (e.g., mask MA) is held on the support structure (e.g., mask table MT) and is patterned by the patterning device. Mask MA can be clamped to mask table MT on both surfaces of the mask. By clamping mask MA on both surfaces, the mask can be subjected to large accelerations without slipping or deformation. The clamping, or holding force may be applied using thin membranes, which further prevent deformation of the mask. By the clamp, a normal force between adjacent surfaces of the mask and mask table MT is generated, resulting in a friction between contacting surfaces of the mask and the mask table. The clamping force to the surfaces of mask MA may be generated using electrostatic or mechanical clamping techniques.

Figure 7:
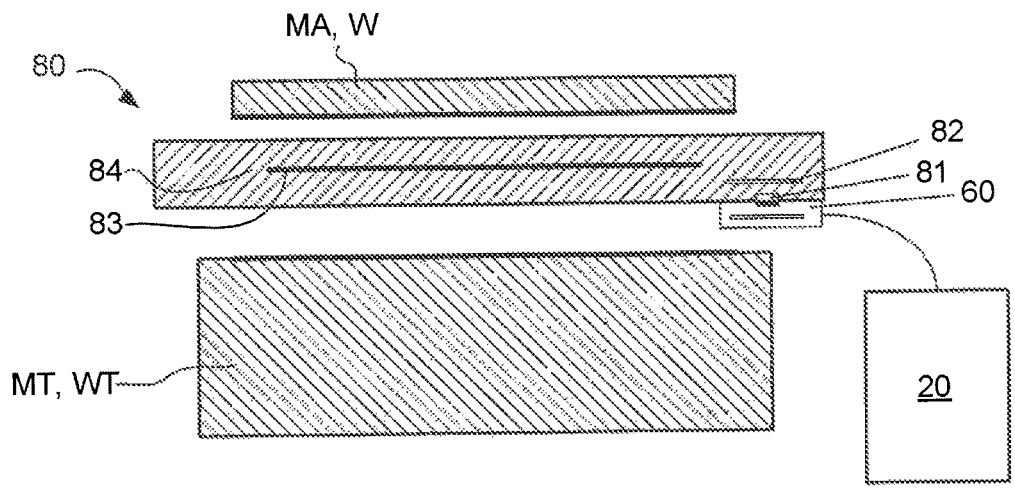
FIG. 7 depicts an electrostatic clamp connected to a power supply according to an embodiment of the invention.

In EUV lithographic processes, electrostatic clamps may be used to clamp mask MA to mask table MT and/or substrate W to substrate table WT. FIG. 7 depicts an exemplary electrostatic clamp that is connected to a power supply 20 via an electrical connector 60 according to an embodiment of the present invention. In the exemplary electrostatic clamp 80 depicted in FIG. 7, a chuck 84 includes a dielectric or slightly conductive body with an embedded electrode 83. Power supply 20 is used to apply a potential difference between mask MA or substrate W and chuck 84 and between chuck 84 and table MT, WT so that electrostatic forces clamp mask MA or substrate W and chuck 84 to the table MT, WT. Embedded electrode 83 is connected to power supply 20.

Radiation beam B is incident on the patterning device (e.g., mask MA). Having traversed mask MA, radiation beam B passes through projection system PS, which focuses the beam onto a target portion C of substrate W. With the aid of the second positioner PW and position sensor IF2 (e.g., an interferometric device, linear encoder or capacitive sensor), substrate table WT can be moved accurately, e.g., so as to position different target portions C in the path of radiation beam B. Similarly, first positioner PM and another position sensor IF1 can be used to accurately position mask MA with respect to the path of radiation beam B, e.g., after mechanical retrieval from a mask library, or during a scan. In general, movement of mask table MT may be realized with the aid of a long-stroke module (coarse positioning) and a short-stroke module (fine positioning), which form part of first positioner PM. Similarly, movement of substrate table WT may be realized using a long-stroke module and a short-stroke module, which form part of second positioner PW. In the case of a stepper (as opposed to a scanner) mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on mask MA, the mask alignment marks may be located between the dies.

The depicted apparatus could be used in at least one of the following modes:

In step mode, mask table MT and substrate table WT are kept essentially stationary, while an entire pattern imparted to the radiation beam is projected onto a target portion C at one time (i.e., a single static exposure). Substrate table WT is then shifted in the X and/or Y direction so that a different target portion C can be exposed. In step mode, the maximum size of the exposure field limits the size of the target portion C imaged in a single static exposure.

In scan mode, mask table MT and substrate table WT are scanned synchronously while a pattern imparted to the radiation beam is projected onto a target portion C (i.e., a single dynamic exposure). The velocity and direction of substrate table WT relative to mask table MT may be determined by the (de-)magnification and image reversal characteristics of projection system PS. In scan mode, the maximum size of the exposure field limits the width (in the non-scanning direction) of the target portion in a single dynamic exposure, whereas the length of the scanning motion determines the height (in the scanning direction) of the target portion.

In another mode, mask table MT is kept essentially stationary holding a programmable patterning device, and substrate table WT is moved or scanned while a pattern imparted to the radiation beam is projected onto a target portion C. In this mode, generally a pulsed radiation source is employed and the programmable patterning device is updated as required after each movement of substrate table WT or in between successive radiation pulses during a scan. This mode of operation can be readily applied to maskless lithography that utilizes programmable patterning device, such as a programmable mirror array of a type as referred to above.

In a lithographic projection apparatus according to the present invention, at least one of first object table MT (support structure for supporting the patterning means, the mask) and second object table WT (the substrate table) are provided in a vacuum chamber VC. The vacuum inside vacuum chamber VC is created with evacuating means VE, for example a pump.

Combinations and/or variations on the above described modes of use or entirely different modes of use may also be employed.

First positioner PM, second positioner PW, the motors that control any blades that may be included in the masking device, and any clamps that may be included in the lithographic projection apparatus are powered by a high voltage power supply. In particular, the electrodes of an electrostatic clamp used for clamping a substrate W to a substrate table WT or a mask M to a mask table MT in near-vacuum conditions are connected to a bi-polar high voltage supply.

In a lithographic apparatus that uses extreme ultraviolet light as a radiation source, the path of the EUV radiation beam through the lithographic apparatus is enclosed within a vacuum environment. Here, vacuum is taken to mean a very low pressure, such as less than 100 Pa, or even less than 10 Pa, for example. A very low pressure is used to reduce the amount of EUV radiation that would otherwise be absorbed by the gas particles.

In such an EUV lithographic apparatus, the substrate and the substrate table are enclosed within a vacuum environment. In order to clamp the substrate to the substrate table, instead of a vacuum clamp, an electrostatic clamp is used. The vacuum clamp is not effective because the ambient pressure is too low to provide sufficient force to clamp the substrate to the substrate table. An electrostatic clamp may be used in a lithographic apparatus for other purposes, for example to clamp a reticle to a reticle stage. The electrostatic clamp requires high voltage to provide sufficient clamping force.

When high voltage is used, the possibility of electrical breakdown is increased with respect to electrical components that operate at lower voltages. Here, high voltage is taken to mean a voltage of greater than 1 kV, greater than 2 kV, greater than 3 kV, greater than 5 kV or even greater than 10 kV. Electrical breakdown at high voltage can at least cause damage to, and often destroy, electrical components.

Electrical breakdown poses a health risk. In particular, electrical breakdown is an increased risk at points of wiring or components that are at high voltage and are at least partially exposed to gas. This may be the case at the terminal of wiring or of a component, for example. It is desirable to provide an electrical connector, an electrical connection system and a lithographic apparatus with an electrical component that can withstand high voltages.

Figure 2:
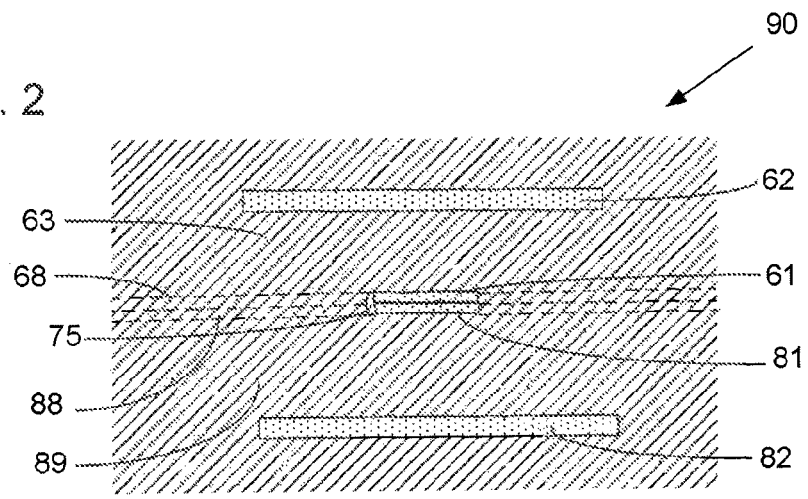
FIG. 2 depicts a schematic view of a high voltage electrical connection system according to an embodiment of the invention.

The lithographic apparatus may comprise an electrostatic clamp 80, as illustrated in FIG. 7. The electrostatic clamp 80 is connected to a high voltage power supply 20 by at least one electrical connector 60. The interconnection between the electrical connector 60 and the electrostatic clamp 80 is an electrical connection system 90, as illustrated in FIG. 2. If a plurality of electrical connectors 60 are used, then the interconnection between two electrical connectors 60 is an electrical connection system 90. The electrical connector 60 and the electrical connection system 90 may be used in applications other than in a lithographic apparatus. The electrical connection system 90 may connect any two electrical components, i.e., not necessarily the electrical connector 60 or electrostatic clamp 80 of the present invention.

Specifically, FIG. 2 depicts an electrical connection system 90 according to the present invention. The electrical connection system 90 comprises a high voltage supply pad 61 and a high voltage receipt pad 81. The supply pad 61 and the receipt pad 81 are electrically connected to each other. The supply pad 61 is a part of an electrical connector 60. The receipt pad 81 is a part of an electrical component other than the electrical connector 60. The electrical component may be an electrostatic clamp 80 of a lithographic apparatus. The electrical component may be another electrical connector, equivalent to the electrical connector 60.

The supply pad 61 and the receipt pad 81 are positioned in a region that is substantially an equipotential. In the vicinity of the pads 61, 81, the voltage does not vary significantly. The electric field in the region in which the pads are disposed is low, even when the electrical connection system 90 is connected to a high voltage. According to the present invention, a low electric field may be an electric field of less than about 1 kV/mm, less than about 0.5 kV/mm, or preferably less than or equal to about 0.3 kV/mm. The strength of the electric field should be ensured to be within acceptable tolerances. The acceptable value for the electric field depends on the dielectric strength of the materials used to form the electrical connector 60 and electrical component of the electrical connection system 90.

By positioning the pads 61, 81 in a region that is substantially an equipotential, the possibility of electrical breakdown is reduced. The supply pad 61 is a part of the electrical connector 60 that is at least partially exposed to the atmosphere. The receipt pad 81 is a part of the electrical component that is at least partially exposed to the atmosphere. When the supply pad 61 and the receipt pad 81 are brought into electrical contact with each other, it is desirable for the supply pad 61 and the receipt pad 81 to be in contact with only solid materials. In particular, it is desirable that the pads 61, 81 are in contact with each other, with a conductor that forms a part of the electrical connector 60 or electrical component, and solid insulating material. The insulating material may be termed potting material.

In practice it is very difficult to completely cover the whole surface of the supply pad 61 and the receipt pad 81. There may be a gas pocket 75, which gas comes into contact with a surface of at least one of the supply pad 61 and the receipt pad 81. The supply pad 61 and the receipt pad 81 may be in contact with a solid material. In particular, the minor surface of the supply pad 61 may be covered by a supply pad insulator 68. The major surface of the supply pad 61 opposite the surface that faces the receipt pad 81 may be covered by an inner insulation layer 63. The minor surface of the receipt pad 81 may be covered by a receipt pad insulator 88. The major surface of the receipt pad 81 opposite the surface that faces the supply pad 61 may be covered by a component insulator 89.

A part of the surface of the supply pad 61 and a part of the surface of the receipt pad 81 come into contact with both a gas (e.g., the gas pocket 75) and a solid insulator (e.g., the supply pad insulator 68 and the receipt pad insulator 88). The point at which a conductor (e.g., the pad 61, 81), a gas (e.g., the gas pocket 75) and a solid insulator (e.g., the insulator 68, 88) meet is termed a "triple point".

At such a triple point, the magnitude of the electric field is increased. This is because the component of the electric field that is normal to the surface of the conductor (e.g., the pad 61,81) is amplified. The factor of amplification depends on the dielectric constant of the gas and of the insulator. For example, if the gas is air, which has a dielectric constant of about 1, and the solid insulator is a polyimide, which has a dielectric constant of about 3, then the amplification factor for the electric field is about 3×. Hence, electrical breakdown is a particularly pertinent danger at a triple point, and a triple point is most likely to occur, albeit undesirably, at the terminals of electrical components.

Field emission of electrons is most likely to occur at a triple point. This can result in ionisation of the gas at the triple point. The gas may be air, or hydrogen for example. Corona discharge can occur, heating up the insulator. Solid insulators can break down due to overheating. A polymer dielectric used as the insulator (i.e., as the supply pad insulator 68 and/or the receipt pad insulator 88) may decompose under these conditions. A glass used as the insulating material may become cracked due to the resulting mechanical stress.

Partial electrical discharge can occur at gas bubbles, which may be present within the insulator, for example. These gas bubbles may not be triple points because a conducting surface does not come into contact with the gas and the insulator. Although these gas bubbles are problematic, the triple points are more problematic.

One way to reduce the possibility of electrical breakdown is to reduce the voltage of the electrical system. However, according to the present invention, it is ensured that the terminals in an electrical connection system 90 are positioned at an equipotential such that the electrical field is low. This reduces the possibility of electrical breakdown while allowing a high voltage to be used.

One way to ensure that the supply pad 61 and the receipt pad 81 are at a position of equipotential is to provide a high voltage plate on either side of the pads 61, 81. In the electrical connection system 90, the electrical connector 60 may comprise a high voltage supply plate 62. The electrical component 80 may comprise a high voltage receipt plate 82. The high voltage plate 62, 82 is bigger than the corresponding high voltage pad 61, 81. Preferably, the high voltage plate 62, 82 is substantially parallel to the corresponding high voltage pad 61, 81.

The supply pad 61 lies substantially wholly within the supply plate 62 when viewed in a direction perpendicular to the plane of the supply pad 61. The receipt pad 81 lies substantially wholly within the receipt plate 82 when viewed, for example, in a direction perpendicular to the plane of the receipt pad 81, as viewed in this cross-section. The plates 62, 82 are at substantially the same voltage as the pads 61, 81. The purpose of the plates 62, 82 is to produce a region in which the voltage is high throughout the region. The pads 61, 81 are positioned within the region.

The pads 61, 81 are positioned substantially wholly within a volume that has as its edges the plates 62, 82 and surfaces extending between the perimeters of the plates 62, 82.

It is possible that a portion of a high voltage pad 61, 81 of the electrical connection system 90 does not lie within the corresponding high voltage plate 62, 82, provided that the plates produce a region at substantially an equipotential. For example, at least one of the high voltage plates 62, 82 may have a hole or a slit within the plate, at which point the corresponding high voltage pad 61, 81 does not overlap the corresponding plate 62, 82. However, substantially all of the high voltage pad 61, 81 overlaps the corresponding high voltage plate 62, 82.

The inner insulation layer 63 of the electrical connector 60 is interposed between the supply pad 61 and the high voltage supply plate 62 of the electrical connector 60. The component insulator 89 is interposed between the receipt pad 81 and the high voltage receipt plate 82 of the electrical component. The high voltage plates 62, 82 are substantially surrounded by solid materials. In particular, the high voltage supply plate 62 of the electrical connector is sandwiched between the inner insulating layer 63 and an outer insulating layer 64. The purpose of surrounding the plates 62, 82 by solid materials is to prevent the occurrence of triple points at the surface of the plates 62, 82.

As mentioned above, the high voltage plate 62, 82 is larger than the corresponding high voltage pad 61, 81 and is positioned to overlap substantially all of the high voltage pad 61, 81. Preferably, the minimum distance of overlap, d, is at least h, where h is the distance between the high voltage pad 61, 81 and the corresponding high voltage plate 62, 82. The distance h is measured in a direction perpendicular to the plane of the pad 61, 81 and corresponding plate 62, 82. The distance h is the minimum distance between the pad 61, 81 and the corresponding plate 62, 82. The distance h is the thickness of the inner insulating layer 63, or the thickness of the component insulator 89. Preferably, the plate 62, 82 overlaps the entire perimeter of the pad 61, 81 by at least the distance h. If d=h, then the electric field strength at the surface of the pads 61, 81, is approximately 10-15% of the maximum value (i.e., in the case where no plates 62, 82 were provided). If d=0, then the field strength is about 50% of its maximum value.

In an embodiment, the distance of overlap, the minimum distance between a perimeter of the plate 62, 82 and the perimeter of the corresponding pad 61, 81 is at least 2h, preferably at least 3h, more preferably at least 4h and even more preferably at least 5h. If d is at least 5h, then the field strength is negligibly small.

Figure 3:
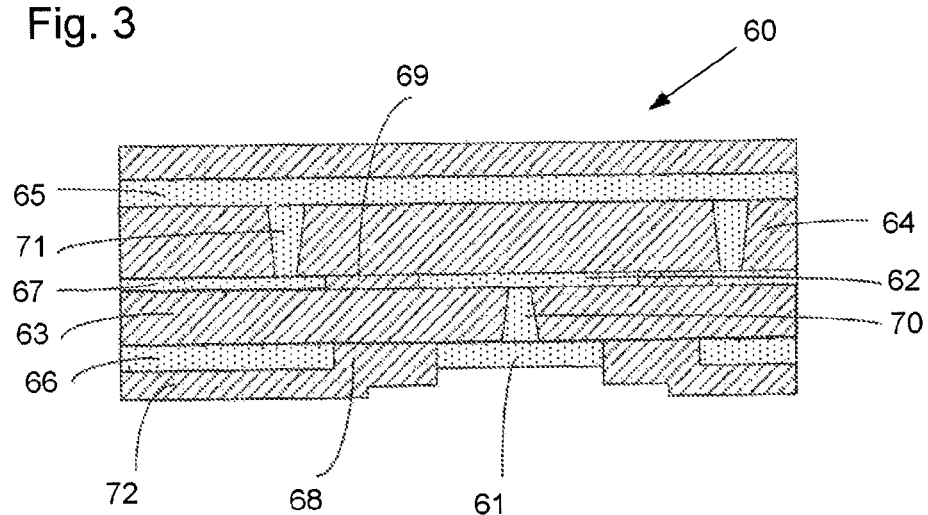
FIG. 3 depicts a schematic view of a planar electrical connectors according to an embodiment of the invention.
Figure 4:
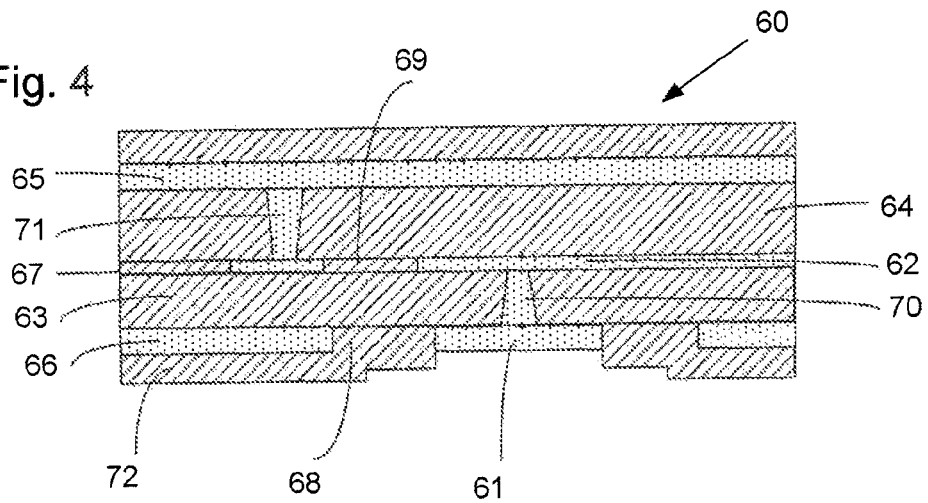
FIG. 4 depicts a schematic view of a planar electrical connector according to one embodiment of the invention.
Figure 5:
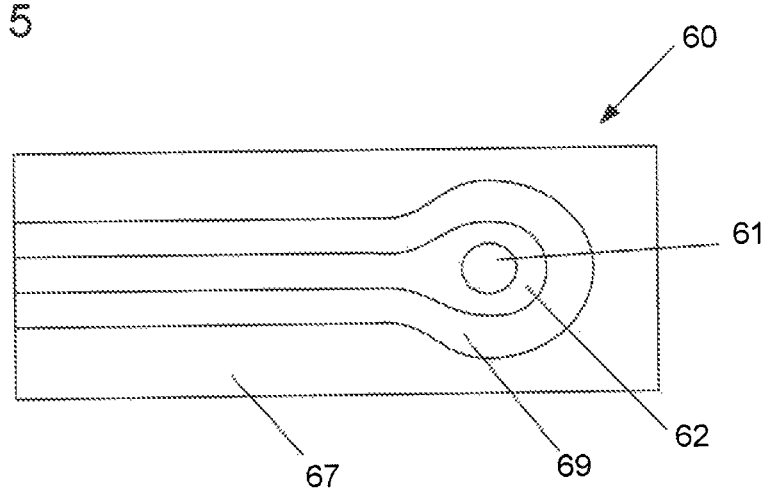
FIG. 5 depicts a schematic view of a planar electrical connector according to one embodiment of the invention.

FIG. 3, FIG. 4 and FIG. 5 depict an electrical connector 60 according to the present invention. The electrical connector 60 comprises a laminate that comprises, in order a shield layer 65, an outer insulating layer 64, a high voltage supply plate 62, an inner insulating layer 63 and a high voltage supply pad 61. The laminate may be flexible. The insulating layers 63, 64 are made of an insulating material. The insulating material may be flexible, such as a polyimide, or the like. The insulating material may be inflexible, for example a float glass or an alkali-free glass, or the like. The shield 65, the plate 62 and the pad 61 are made of an electrically conductive material, such as copper, or the like. An insulating layer may be positioned on an outside of the laminate, thereby sandwiching the shield layer 65.

The high voltage supply pad 61 is a terminal of the electrical connector 60. The supply pad 61 may be connected electrically to a high voltage supply pad 61 of another electrical connector 60, or to a high voltage receipt pad 81 of an electrostatic clamp 80 of a lithographic apparatus, for example. The high voltage supply plate 62, as described above, contributes to the formation of a region of equipotential in which the supply pad 61 is positioned when the electrical connector 60 is in use.

The relationship between the dimensions of the supply plate 62 and the supply pad 61 are as described above in relation to the electrical connection system 90 of the present invention. In particular, where the same reference numeral of a component is used in different parts of this description, the characteristics, whether inherent or in relation to another component, of that component described in relation to one embodiment of the invention are equally applicable to that component in other embodiments of the invention.

The plate 62 is at the same voltage as the supply pad 61 when the electrical connector 60 is in use. Preferably, the high voltage supply plate 62 is integral with a high voltage trace within the same layer of the laminate.

FIG. 3 depicts the electrical connector 60 viewed in cross section, the cross section being perpendicular to the longitudinal direction of the high voltage trace of the electrical connector 60. The supply pad 61 is surrounded within the plane of the supply pad 61 by a supply pad insulator 68. The supply pad insulator 68 is arranged to cover a minor surface of the supply pad 61. In practice, it may be difficult to cover the whole of the minor surface of the supply pad 61 with insulating material without preventing electrical contact between the supply pad 61 and the electrical component to which electrical connection is made. As such, a gas bubble 75 may be situated between the supply pad 61 and the supply pad insulator 68. If electrical breakdown occurs, then the supply pad insulator 68 may get damaged. However, by having the plate 62 larger than the supply pad 61 such that the pad 61 lies substantially wholly within the plate 62 when viewed in a direction perpendicular to the plate 62, the possibility of electrical breakdown is reduced.

Preferably, the electrical connector 60 comprises a supply pad shield 66 within the same layer of the laminate as the supply pad 61. The supply pad insulator 68 is interposed between the supply pad 61 and the supply pad shield 66. The shield layer 65 and the supply pad shield 66 are connected to electrical ground.

The purpose of the shield layer 65 and the supply pad shield 66 is to prevent electrical breakdown by enclosing the electric field between the nigh voltage plate 62 and trace and the shield layer 65, 66. The region between the high voltage plate 62 and trace and the shield layers 65, 66 is filled by the inner insulating layer 63 and the outer insulating layer 64.

Preferably, the high voltage supply pad 61 is electrically connected to the high voltage supply plate 62 by at least one high voltage via 70. This allows electrical current to pass through the high voltage trace, through the high voltage supply plate 62, through the high voltage via 70 to the high voltage supply pad 61.

FIG. 4 depicts the electrical connector 60 viewed in cross section, the cross section being parallel to the direction of elongation of the high voltage trace of the electrical connector 60. Within the layer of the laminate in which the high voltage supply plate 62 is positioned, the plate 62 may be surrounded by a plate insulator 69. The plate is surrounded in a plane of the plate by the dielectric 69 such that the plate is fully surrounded in a cross section of the laminate by solid material. The plate insulator 69 covers a minor surface of the plate 62 except for the section of the plate 62 that is extended to form an integral connection with the high voltage trace. The plate insulator 69 is interposed between the plate 62 and a plate shield 67, which is configured to be connected to electrical ground. The plate shield 67 is within the same layer of the laminate as the plate 62.

Preferably the supply pad shield 66 is connected to the plate shield 67 by at least one ground via 71. Preferably, the plate shield 67 is connected to the ground shield layer 65 by at least one ground via 71. Preferably, the supply pad shield 66 is connected to the ground shield layer 65 by at least one ground via 71.

In an alternative embodiment, the plate 62 is not integral with the high voltage trace but is in a different layer of the laminate. In this case, the plate 62 may be electrically connected to the high voltage trace by a via, or alternatively the plate 62 may be connected to a separate high voltage supply such that the plate 62 is at substantially the same voltage as the high voltage supply pad 61.

The insulating material used for any of the insulating layers or sections of insulation of the electrical connector may be made of, for example, a polyimide, or a float glass, but other known insulators may be employed. The layers of the laminate may be adhered together using, for example, an epoxy adhesive, an acrylic adhesive or a polyurethane adhesive.

Preferably, the laminate comprises a triple point insulator 72, which may be termed a ground shield insulator, configured to cover the supply pad shield 66. The purpose of the triple point insulator 72 is to prevent the formation of triple points, as described above, at the surface of the supply pad shield 66. The triple point insulator may cover substantially all of the outward facing surface of the supply pad shield 66. The triple point insulator 72 includes a hole at the high voltage supply pad 61 to allow the supply pad 61 to be electrically connected to another electrical component.

Figure 9:
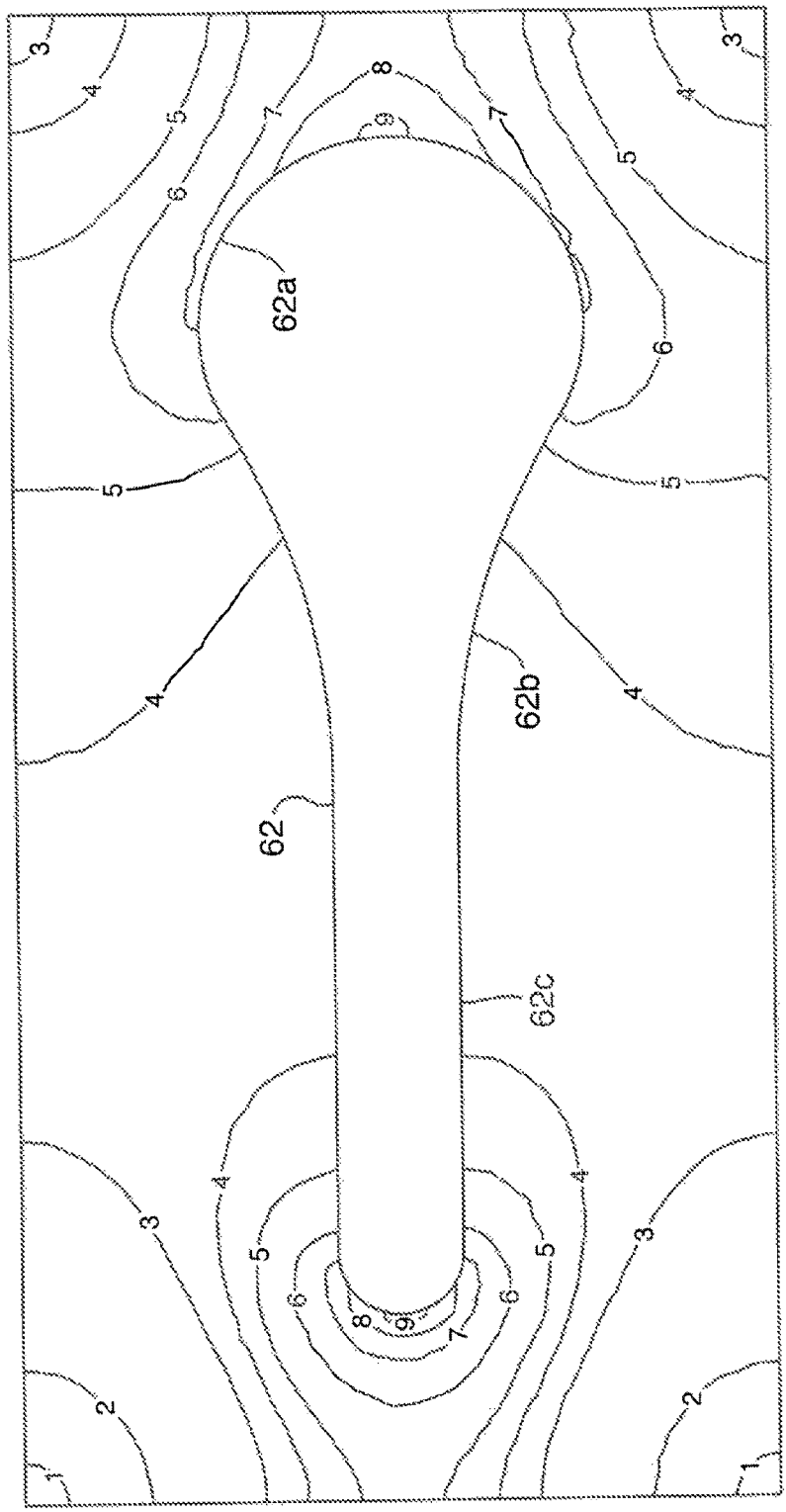
FIG. 9 depicts a plan view of the electric field map around a plate of an electrical connector according to an embodiment of the invention.

FIG. 5 depicts the electrical connector 60 in plan view, with the plane of the paper in the same plane as the laminate. The supply pad insulator 68, the supply pad shield 66, the inner insulating layer 63 and the triple point insulator 72 are not depicted for illustrative reasons only. As depicted in FIG. 9, the supply pad 61 is smaller than the supply plate 62 and lies substantially wholly within the supply plate 62.

FIG. 9 depicts an embodiment of the invention in which the plate 62 takes the form of a teardrop shape. The teardrop shape may be described as being formed primarily of two parts. One part 62a is substantially circular, or oval, for example. The substantially circular part 62a overlaps substantially all of the supply pad 61. Another part of the teardrop shape is a tapered part 62b. The tapered part is extended to form a high voltage trace 62c. The plate 62 does not have to be circular or oval in part. Contour lines in FIG. 9 show the electric field strength in the region in arbitrary units around the plate 62. The electric field is strongest at the end of the high voltage trace and at the edge of the circular part furthest away from the high voltage trace.

Figure 10:
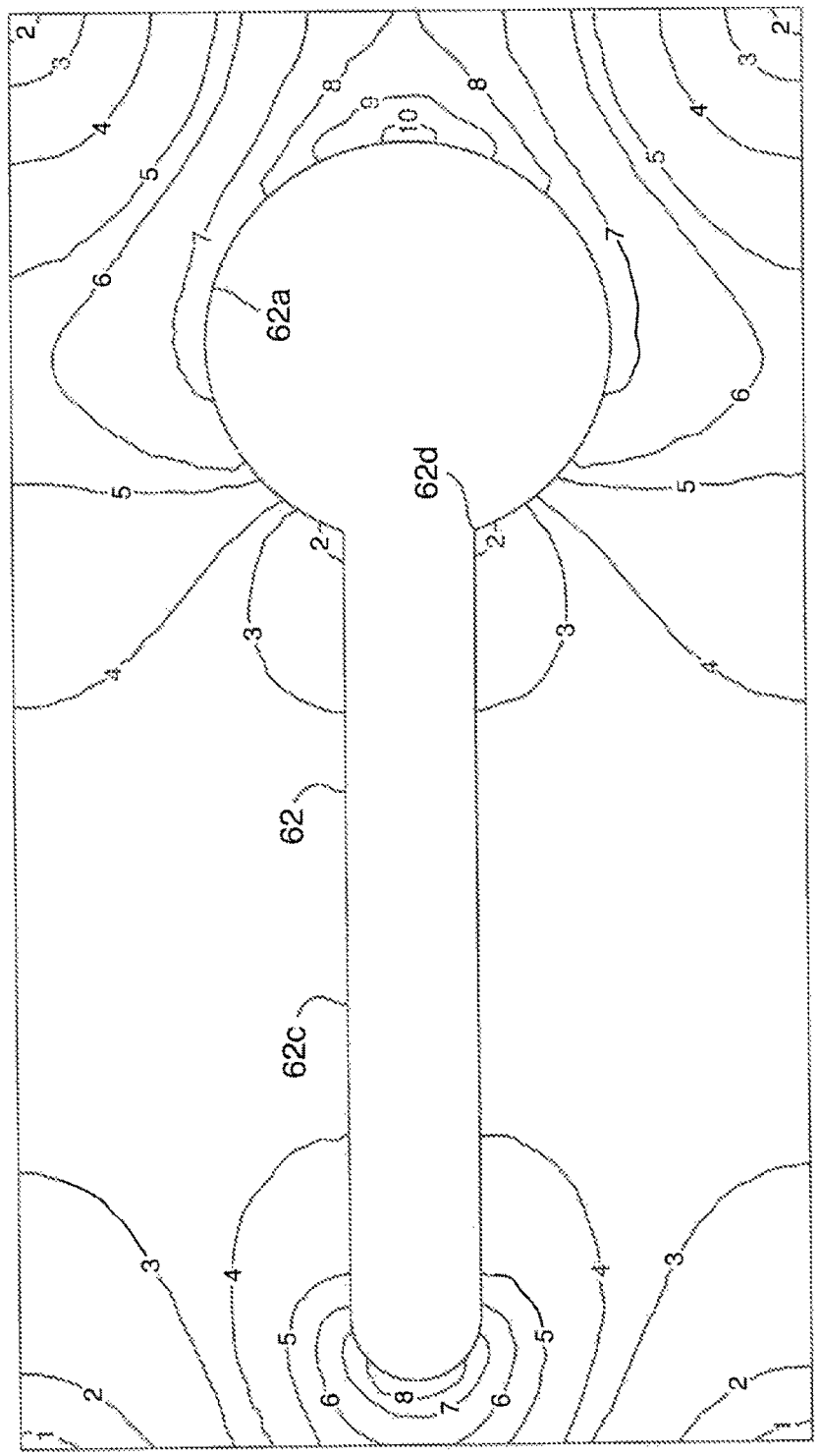
FIG. 10 depicts a plan view of the electric field map around a plate of an electrical connector according to an embodiment of the invention.

FIG. 10 depicts an embodiment in which the plate 62 has a substantially circular shape 62a with a high voltage trace 62c extending radially from the circular shape. Contour lines in FIG. 10 show the electric field strength in the region surrounding the plate in arbitrary units. As can be seen from FIG. 10, although the plate 62 includes a sharp corner 62d, between the circular part 62a and the high voltage trace part 62c, the electric field at this sharp corner is low. As with the shape of the plate depicted in FIG. 9, the electric field is strongest at the extremities of the plate 62, namely at the end of the high voltage trace and at the edge of the circular part furthest from the high voltage trace.

Other shapes, even angular shapes are possible. A rounded shape is preferable to avoid spikes in the electric field values. The sharp corner 62d of the shape of the plate 62 depicted in FIG. 10 is an "internal" corner (i.e., the corner is at a concave point of the shape). Shapes having "external" sharp corners result in high fields at the sharp corners. Similarly for the supply pad 61, the pad 61 may be substantially circular although the shape is not particularly limited.

A minimum distance between the perimeter of the pad 61 of the connector and the pad ground shield 66 is within the range of from about 3h to about 7h, preferably within the range of from about 4h to about 6h, or more preferably about 5h.

Figure 6:
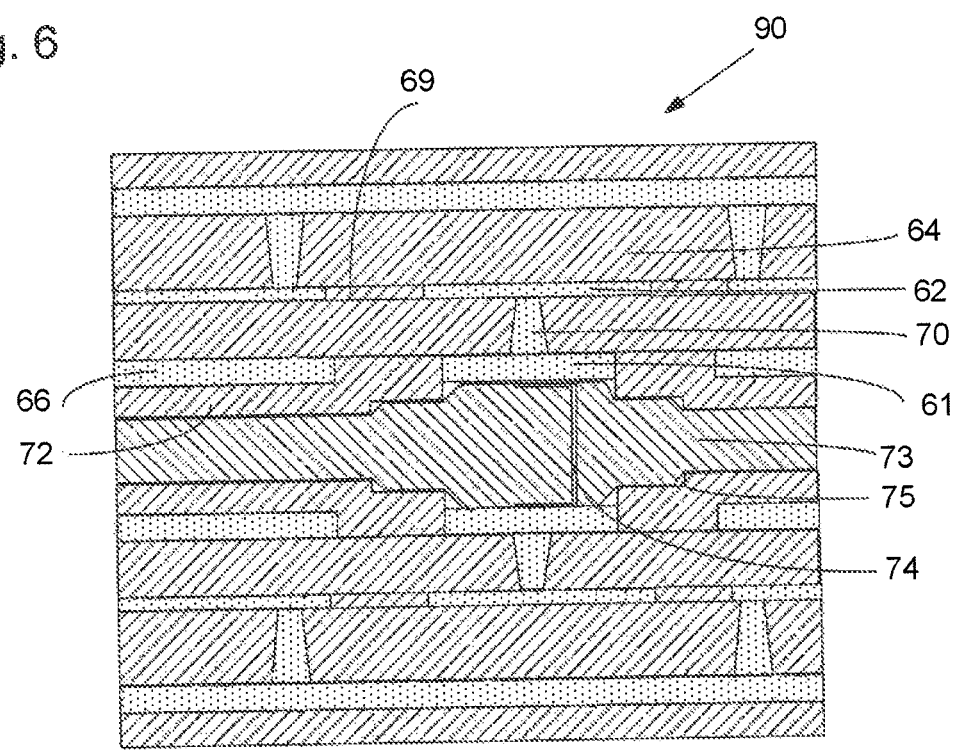
FIG. 6 depicts an electrical connection system connecting two electrical connectors according to an embodiment of the invention.

FIG. 6 depicts an electrical connection system 90 of the present invention. The electrical connection system 90 is formed between two electrical connector 60 of the present invention. The supply pads 61 are in electrical contact with each other. An insulating sheet 73 may be interposed between the two electrical connectors 60. The sheet 73 may be made of a fluoropolymer elastomer, for example. Other types of insulating material may be used for the sheet 73. A material that has an elastic material is preferable in order to allow the electrical connectors 60 to be pressed together tightly, minimizing the presence of gas pockets 75 in the electrical connection system 90. The purpose of the sheet 73 is to fill in the gas pocket between the two electrical connectors 60.

The sheet 73 is pierced by an electrical contact 74. The contact 74 is made of an electrically conductive material, such as stainless steel or copper. The contact 74 extends through the sheet 73. The contact 74 may take the form of a leaf spring such that when the two electrical connectors 60 are pressed together the contact 74 is in a compressed state. This helps to produce a secure connection. As depicted in FIG. 10, gas pockets may be present between the sheet 73 and the facing surfaces of the laminates. If the gas pocket 75 is in contact with a part of the supply pad 61, then a triple point is created. The plates 62, which are at the same voltage as the pads 61, produce an equipotential region encompassing the pads 61.

The two electrical connectors 60 may be held together in the electrical connection system 90 by a screw or by a mechanical clamp, for example. These are not depicted in FIG. 6.

FIG. 7 depicts a section of a lithographic apparatus according to an embodiment of the invention. The lithographic apparatus comprises an electrical component 80. The component 80 comprises a high voltage receipt pad 81 and a high voltage receipt plate 82. The principal of the component 80 is the same as explained in relation to the electrical connection system 90 and the electrical connector 60 of the present invention. The receipt plate 82 contributes to the formation of a region of equipotential when the receipt pad 81 is electrically connected to an electrical connector 60 to form an electrical connection system 90. The component 80 is connected to a high voltage power supply 20.

The component may be an electrostatic clamp 80, as depicted in FIG. 7. The clamp 80 comprises the receipt pad 81 and the receipt plate 82. The clamp 80 further comprises a chuck 84 within which at least one clamp electrode 83 is positioned. The clamp electrode is electrically connected to the receipt pad 81. The clamp 80 is used, for example, to clamp a substrate W to a substrate table WT of the lithographic apparatus. The receipt pad 81 and the receipt plate 82 may have the same characteristics as described in relation to the supply pad 61 and the receipt mate 62 of the electrical connector 60. In an embodiment, the electrode 83 acts as the receipt plate 82.

The supply pad 61 may be glued to the receipt pad 81 by an electrically conductive silver paint. The vicinity of the connection between the supply pad 61 and the receipt 81 may be potted by an epoxy, acrylic or polyurethane adhesive. It is possible for a gas bubble to occur within the potting. As a result, there may be a triple point at the surface of the supply pad 61 and/or at the surface of the receipt pad 81. By positioning the pads 61, 81 in a region that is substantially at an equipotential, the possibility of electrical breakdown is reduced.

FIG. 8 depicts a part of a lithographic apparatus according to an embodiment of the invention. The electrical component 80 of the lithographic apparatus is a control system 220 of blades. The control system comprises a high voltage receipt pad 81 and a high voltage receipt plate 82.

In FIG. 7 and FIG. 8, the electrical component 80 is connected to a high voltage power supply 20 via an electrical connector 60 according to the present invention. FIG. 7 and FIG. 8 are schematic drawings and not to scale. The relative size of the electrical connector 60 may be increased for illustrative purposes.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography, topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The descriptions above are intended to be illustrative, not limiting. Thus, it will be apparent to one skilled in the art that modifications may be made to the invention as described without departing from the scope of the claims set out below.

Figure 11:
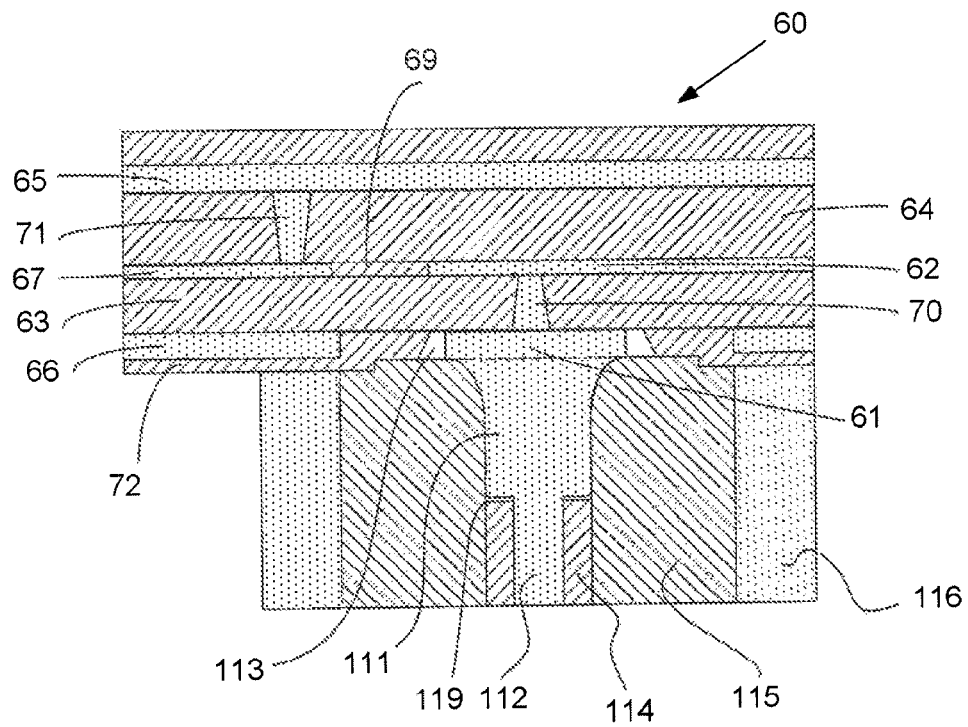
FIG. 11 and FIG. 12 depict an electrical connector 60 according to an embodiment of the invention electrically connected to an elongate electrical connector 112.
Figure 12:
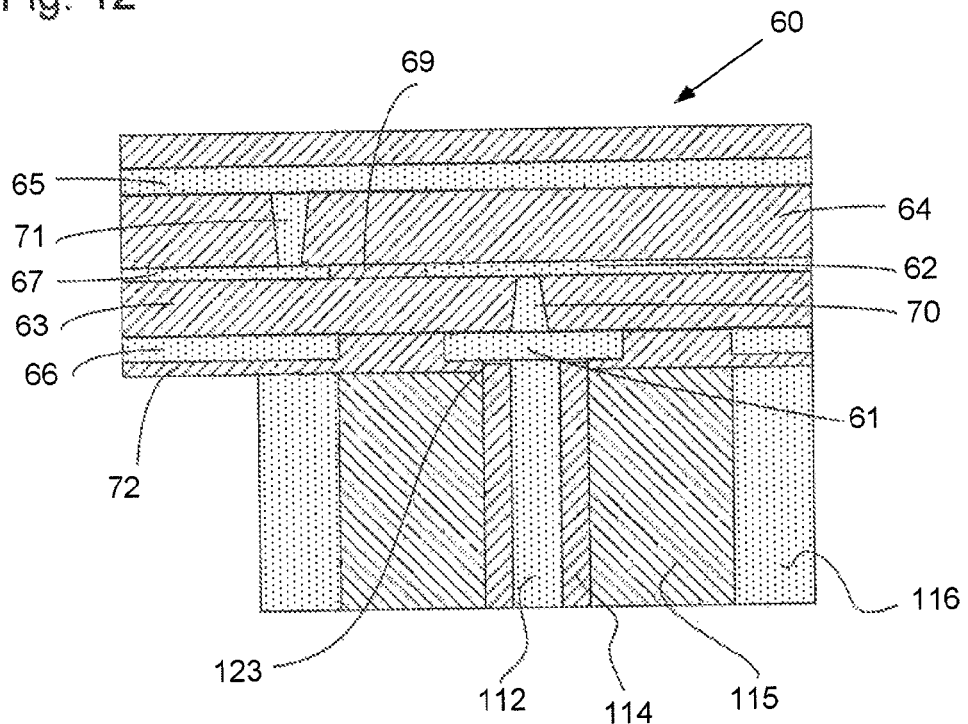

FIG. 11 and FIG. 12 depict an electrical connector 60 according to an embodiment of the invention electrically connected to an elongate electrical connector 112. The electrical connector 60 may be the electrical connector 60 according to any embodiment of the invention. The elongate electrical connector 112 may comprise an electrical wire. The elongate electrical connector 112 may comprise an electrical cable. In an embodiment, the elongate electrical connector 112 comprises a coaxial cable.

In FIG. 11 and FIG. 12, a cross-sectional view of the elongate electrical connector 112 electrically connected to the electrical connector 60 is shown. The electrical connector 60 may be planar and flexible. The elongate electrical connector 112 comprises an elongate electrical conductor. The elongate electrical conductor electrically connects to the high voltage supply pad 61 of the electrical connector 60. This is depicted in FIG. 11 and FIG. 12.

The elongate electrical conductor may be surrounded in cross-section by an electrical insulator 114, 115. The electrical insulator 114, 115 may be disposed between the elongate electrical conductor and an outer shielding sleeve 116. The elongate electrical conductor may be substantial coaxial with the shielding sleeve 116. The diameter of the shielding sleeve 116 may be substantially the same as the inner diameter of the supply pad shield 66 that surrounds the supply pad 61.

FIG. 11 depicts an embodiment in which the cross-sectional area of the elongate electrical conductor increases towards the terminal end of the elongate electrical connector 112. The cross-sectional area of the elongate electrical conductor may be substantially the same as the area of the supply pad 61 of the electrical connector 60. The elongate electrical conductor may comprise a terminal end in the shape of a trumpet. This may be termed a trumpet end 111. The trumpet end 111 may be integral to the elongate electrical conductor. The trumpet end 111 is configured to electrically connect to the supply pad 61 of the electrical connector 60. There may be a step change in the cross-sectional area of the elongate electrical conductor at the start of the trumpet end 111.

The elongate electrical conductor may be surround in cross-section by an inner insulator 114. The inner insulator 114 may comprise a fluorocarbon solid. In an embodiment, the inner insulator 114 comprises PTFE. The inner insulator 114 may surround the elongate electrical conductor in cross-section along substantially the whole of the length of the elongate electrical connector 112 as depicted in FIG. 12. In an embodiment, the inner insulator 114 surrounds substantially the whole length of the elongate electrical conductor except for the trumpet end 111 as depicted in FIG. 11.

The elongate electrical conductor may be surrounded in cross-section by an outer insulator 115. The outer insulator 115 may comprise a synthetic rubber. In an embodiment, the outer insulator 115 comprises a fluoroelastomer. As depicted in FIG. 11, the outer insulator 115 may come into direct contact with the outer surface of the trumpet end 111 of the elongate electrical conductor.

The shielding sleeve 116 may come into direct contact with the outer surface of the outer insulator 115. In an embodiment, the terminal end of the trumpet end 111 is substantially flush with the terminal end of the outer insulator 115, and optionally the inner insulator 114.

As depicted in FIG. 11, there may be a gas gap at the end of the trumpet end 111 that is integrally connected to the rest of the elongate electrical conductor. The gas gap may be at the point along the elongate electrical conductor at which there is a step change in its cross-sectional area. The gas gap may be disposed between the trumpet end 111 and the inner insulator 114.

The gas gap causes a triple point 119 where the gas, the insulators 114, 115 and the elongate electrical conductor meet. In particular, the triple point 119 may be formed at the outer edge of the trumpet end 111 of the electrical conductor at which point the outer edge of the trumpet end 111 comes into contact with the outer insulator 115 and the gas in the gas gap. The presence of the outer insulator 115 amplifies the electrical field at the triple point 119. The electrical field at the triple point 119 may be amplified by a factor of approximately ten.

There is accordingly a danger that electrical breakdown may occur due to the electrical field at the triple point 119. In an embodiment, the outer insulator 115 has sufficiently high insulation properties and is of a sufficient thickness so as to prevent electrical breakdown between the edge of the trumpet end 111 and the inner surface of the shielding sleeve 116 when the elongate electrical conductor is at high voltage. The shielding sleeve 116 may be connected to electrical ground. In an embodiment, the outer insulator 115 may have a thickness (between the outer edge of the trumpet end 111 and the inner surface of the shielding sleeve 116) within the range of from about 1 mm to about 6 mm, more preferably within the range of from about 2.0 mm to about 2.9 mm and preferably about 2.4 mm.

As depicted in FIG. 11, a triple point 113 may be formed at the outer edge of the supply pad 61. This is because in an embodiment, the triple point insulator 72 may not come into contact with the edge of the supply pad 61. As a result, there may be a gas gap between the outer edge of the supply pad 61 and the inner surface of the triple point insulator 72 surrounding the supply pad 61 even when the electrical connector 60 is electrically connected via the supply pad 61 to another electrical connector. The triple point 113 is formed at the outer edge of the supply pad 61 that comes into contact with the gas in the gap and the outer insulator 115. The gas gap may in fact be a vacuum, or be at sufficiently low pressure as to be considered as substantially a vacuum. Similarly, the gas gap at the inner surface of the trumpet end 111 may be at a vacuum pressure.

The supply plate 62 has an area such that the triple point 113 falls within the area of the supply plate 62 when viewed in the longitudinal direction of the elongate electrical connector 112. The presence of the supply plate 62 results in a decrease in the electrical field at the triple point 113. Hence, the supply plate 62 reduces the possibility of electrical breakdown at the triple point 113. Of course, the triple point 113 is not within a true no field zone. This is because as explained in relation to FIG. 2, a true no field zone requires a pair of plates, whereas the electrical connection shown in FIG. 11 has a single high voltage supply plate 62.

FIG. 12 depicts an embodiment in which the elongate electrical conductor does not have a trumpet end. The elongate electrical connector 112 depicted in FIG. 12 does not have the triple point 119 depicted in FIG. 11. This reduces the possibility of electrical breakdown due to the triple point 119.

However, it is still possible for a triple point to be formed at the outer edge of the supply pad 61. As mentioned above, the presence of the supply plate 62 can reduce the electrical field at such a triple point 113. However, in the case of the electrical connection between the flexible planar electrical connector 60 and the elongate electrical connector 112, the triple point 113 is not positioned in a no field zone.

In an embodiment, the triple point insulator 72 covers the outer edge of the supply pad 61. The presence of the triple point insulator 72 acts to eliminate the presence of the triple point 113. This reduces the possibility of electrical breakdown due to the triple point 113. The triple point insulator 72 may extend over a peripheral portion of the externally facing area of the supply pad 61. The triple point insulator 72 comes into direct contact with the outer minor edge of the supply pad 61. The triple point insulator 72 covers substantially all of the minor edge of the supply pad 61.

In the embodiment depicted in FIG. 12, which does not have the trumpet end 111 depicted in FIG. 11, the electrical field at any triple point 113 at the outer edge of the supply pad 61 may be particularly high. This is because of the geometry of the elongate electrical connector 112, which results in a particularly sharp edge at the outer edge of the supply pad 61 where the triple point 113 may be. Hence, it is particularly advantageous for the triple point insulator 72 to cover the outer edge of the supply pad 61 when there is no trumpet end 111 comprised in the elongate electrical conductor of the elongate electrical connector 112.

Figure 13:
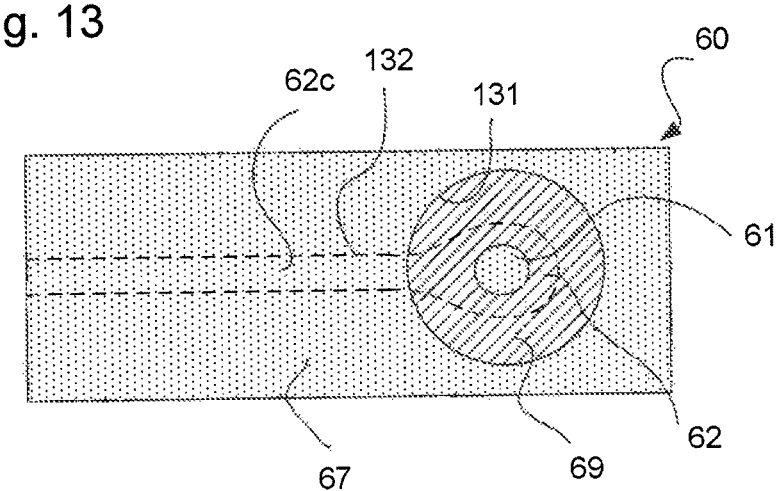
FIG. 13 depicts a plan view of an electrical connector 60.
Figure 14:
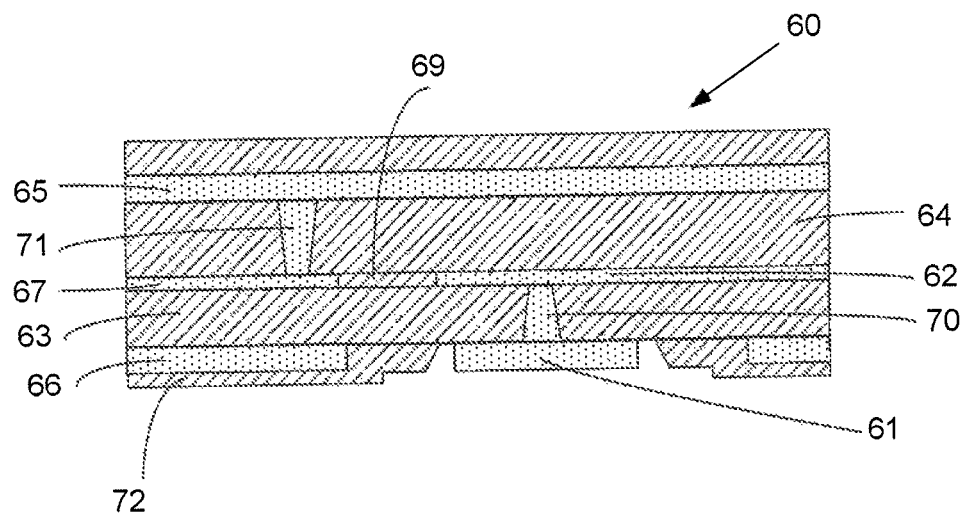
FIG. 14 depicts a cross-sectional view of the electrical connector 60 depicted in FIG. 13.

FIG. 13 depicts in plan view an electrical connector 60 according to an embodiment of the invention. FIG. 14 depicts a cross-sectional view of the electrical connector 60 depicted in FIG. 13. In FIG. 13, the dashed lines represent the boundary between the supply plate 62 and the plate insulator 69. The supply plate 62 and the plate insulator 69 are disposed in the middle layer of the electrical connector 60. The boundary between the high voltage supply pad 61 and the supply pad insulator 68 is shown in a solid line. The boundary between the supply pad insulator 68 and the supply pad shield 66 is shown as a solid line.

The supply pad insulator 68 is disposed in a region in between the outer edge of the high voltage supply pad 61 and the inner edge 131 of the supply pad shield 66. The inner edge 131 of the supply pad shield 66 surrounds the high voltage supply pad 61 in plan view. Plan view means the view in the direction normal to the planes of the laminated layers that form the electrical connector 60.

The inner edge 131 of the supply pad shield 66 may have a substantially circular shape. Other shapes are also possible such as an ellipse, or a quadrilateral, for example.

The supply plate 62 comprises a high voltage trace 62c that extends in an elongate manner from the substantially circular, or oval, for example part 62a of the supply plate 62. The high voltage trace 62c extends from part 62a of the supply plate 62 under the supply pad shield 66. An outer edge 132 of the high voltage trace 62c may be substantially perpendicular to the inner edge 131 of the supply pad shield 66 at the point where the high voltage trace 62c crosses the inner edge 131 of the supply pad shield 66 in plan view. FIG. 13 depicts such an arrangement.

As depicted in FIG. 6, an insulating sheet 73 may be interposed between two electrical connectors 60 so as to block the surface discharge path that would otherwise be present. This reduces the surface electrical discharge that would otherwise lead to failure of the insulator by creating a conductive (e.g., carbonised) path. Although the surface discharge path may be at least reduced and possibly neutralised, gas pockets 75 may remain. This is because of the limited flexibility of the insulating sheet 73. As a result, a triple point can occur at the gas pockets 75.

A triple point in a high electrical field can lead to partial electrical discharge in the gas pockets thereby eroding the gas pockets both mechanically and chemically. This is particularly the case when the system is subjected to an alternating current, for example in an electrostatic clamp system 80. When subjected to an alternating current, a conductive residue can be formed by chemical reactions, resulting in breakdown of the solid insulator. This can in turn blast away the construction by high pressure and temperature.

Hence such triple points can still lead to undesirable electrical breakdown in electrical connections between electrical connectors 60. The potentially problematic partial electrical discharge occurs only where there is a relatively high electrical field. The strength of the electrical field in the electrical connection system is at its greatest at sharp edges in the electrical connector 60. Potting may be used to eliminate the gas pockets 75. However, even using potting insulation may be insufficient to completely avoid partial electrical discharges at sharp edges where the electrical field strength is high. If the electrical field strength is great enough, then partial electrical discharge can result in breakdown of the potting insulation.

As described above, a supply plate 62 that is dimensionally bigger than the high voltage supply pad 61 can reduce the effect of triple points in the electrical connection system. However, it is still possible for relatively high electrical fields to occur at the points where the high voltage trace 62c of the supply plate 62 runs underneath the supply pad shield 66.

Figure 15:
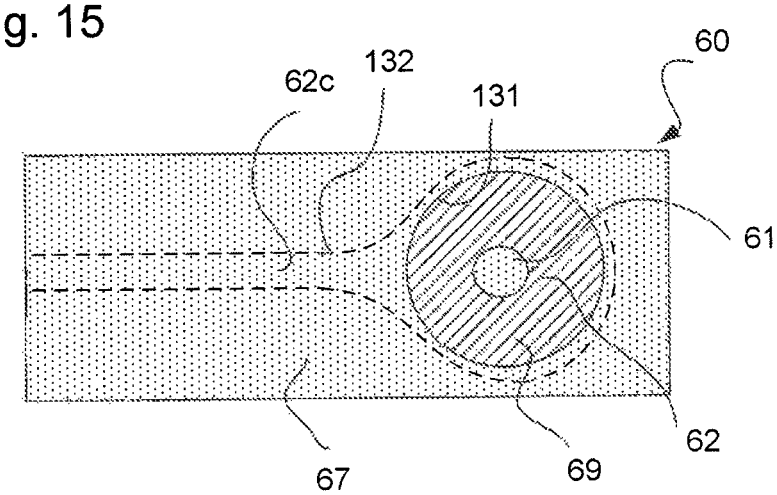
FIG. 15 depicts an electrical connector 60 in plan view.
Figure 16:
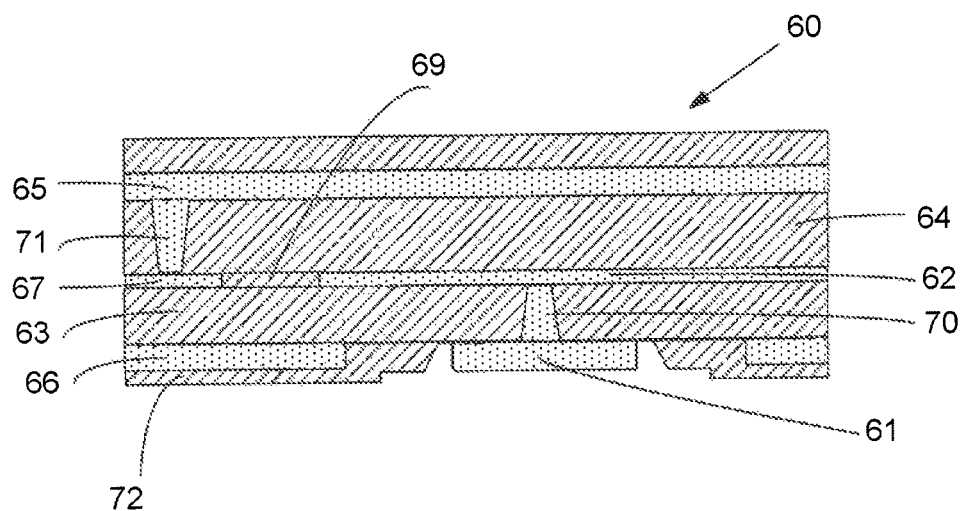
FIG. 16 depicts the electrical connector 60 of FIG. 15 in cross-sectional view.

FIG. 15 depicts an electrical connector 60 in plan view. FIG. 16 depicts the electrical connector 60 depicted in FIG. 15 in cross-sectional view. The electrical connector depicted in FIGS. 15 and 16 addresses the issue of partial electrical breakdown due to high field strength at the intersection between the edge 132 of the high voltage trace 62c and the edge 131 of the supply pad shield 66.

In FIG. 15, the dashed lines represent the boundary between the supply plate 62 and the plate insulator 69. The supply plate 62 and the plate insulator 69 are disposed in the middle layer of the electrical connector 60. The boundary between the high voltage supply pad 61 and the supply pad insulator 68 is shown in a solid line. The boundary between the supply pad insulator 68 and the supply pad shield 66 is shown as a solid line.

The electrical connector 60 depicted in FIGS. 15 and 16 is different from the electrical connector 60 depicted in FIGS. 13 and 14 in that the inner edge 131 of the supply pad shield 66 does not cross the outer edge 132 of the supply plate 62 perpendicularly. In fact, as depicted in FIGS. 15 and 16, the inner edge 131 of the supply pad shield 66 does not cross the outer edge 132 of the supply plate 62. This is because the inner edge 131 of the supply pad shield 66 lies substantially wholly within the supply plate 62 when viewed in a direction perpendicular to a plane of the laminate. The supply plate 62 is dimensionally bigger than the shape defined by the inner edge 131 of the supply pad shield 66.

As a result of the construction of the electrical connector 60 depicted in FIGS. 15 and 16, the peak electrical field strength of the electrical connection system is decreased. In particular, the electrical field strength at the inner edge 131 of the supply pad shield 66 is decreased.

This is because electrical breakdown can otherwise take place at the intersection between the outer edge 132 of the high voltage trace 62c and the inner edge 131 of the supply pad shield 66, which is grounded. This is because both edges 131, 132 can exhibit a relatively high electrical field strength.

According to the construction depicted in FIGS. 15 and 16, the electrical field strength at the outer edge 132 of the high voltage trace 62c may be high. This is because the electrical field strength is inevitably high at the edge of the conductor at high voltage. However, according to the electrical connector 60 of FIG. 15, the outer edge 132 of the high voltage trace 62c opposes the plane of the supply pad shield 66 (rather than the inner edge 131 of the supply pad shield 66). Hence, the electrical field strength at the supply pad shield 66 opposing the outer edge 132 of the high voltage trace 62c is relatively low.

Hence, the possibility of electrical breakdown is reduced. This is because electrical breakdown is more likely to occur at a point in the electrical connection system where the edges of two conductors are in close proximity, compared to the edge of one conductor being in close proximity to the plane of another conductor.

FIG. 17 depicts in plan view an electrical connector 60 according to an embodiment of the invention. In particular, the shape of the supply plate 62 of the electrical connector depicted in FIG. 17 is different from as described above.

The supply plate 62 depicted in FIG. 17 comprises a portion having a grid pattern. The supply plate 62 is discontinuous in that the supply plate 62 surrounds several insulating portions 171. Hence, the supply the plate 62 depicted in FIG. 17 is of a lower density compared to the supply plate 62 described above.

The purpose of the lower density supply plate 62 of FIG. 17 is to produce a relatively sparse electrical field when the supply plate 62 is connected to a high voltage supply. According to the constructions depicted in FIG. 17, the electrical field is spread out over a larger area, thereby decreasing its concentration.

The purpose of the sparse field construction of FIG. 17 is to decrease the strength of the electrical field at the point at which the edges 132 of the high voltage trace 62c of the supply plate 62 intercept an edge 195 of a grounded plane such as the supply pad shield 66. The high voltage trace 62c depicted in FIG. 17 comprises a plurality of narrow traces 62e. The number of the narrow traces 62e is not particularly limited.

In an embodiment, the width of the grid pattern of the high voltage trace 62c, which is equal to the combined width of the narrow traces 62e and the insulating portions 171, is approximately five times greater than the perpendicular distance between the high voltage trace 62e and the grounded plane such as the supply pad shield 66.

FIG. 18 depicts an embodiment of a supply plate 62 of the invention in which the narrow traces 62e take the form of a hatched pattern. The supply plate 62 may comprise a portion having a hatched pattern. This produces the sparse electrical field effect that reduces the chance of electrical breakdown between the supply plate 62 and the grounded plane such as the supply pad shield 66.

Figure 19:
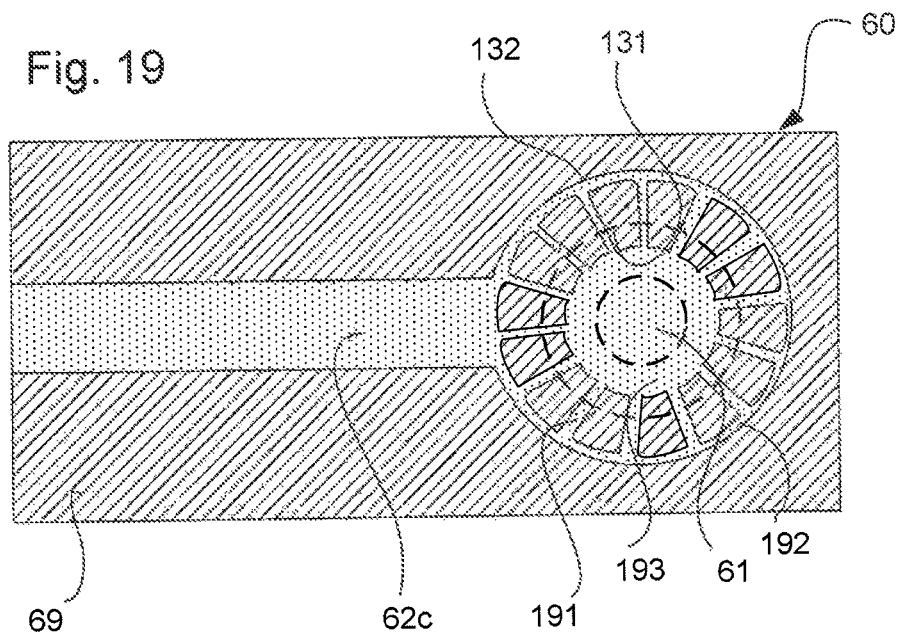
FIG. 19 depicts in plan view an electrical connector 60 according to an embodiment.

FIG. 19 depicts in plan view an embodiment of an electrical connector 60. The shape of the supply plate 62 of the electrical connector 60 depicted in FIG. 19 is different from those described above. The supply plate 62 comprises a portion in the shape of a spoked wheel. In an embodiment, the spoked wheel portion is substantially coaxial with the high voltage supply pad 61 of the electrical connector 60 in plan view.

Figure 20:
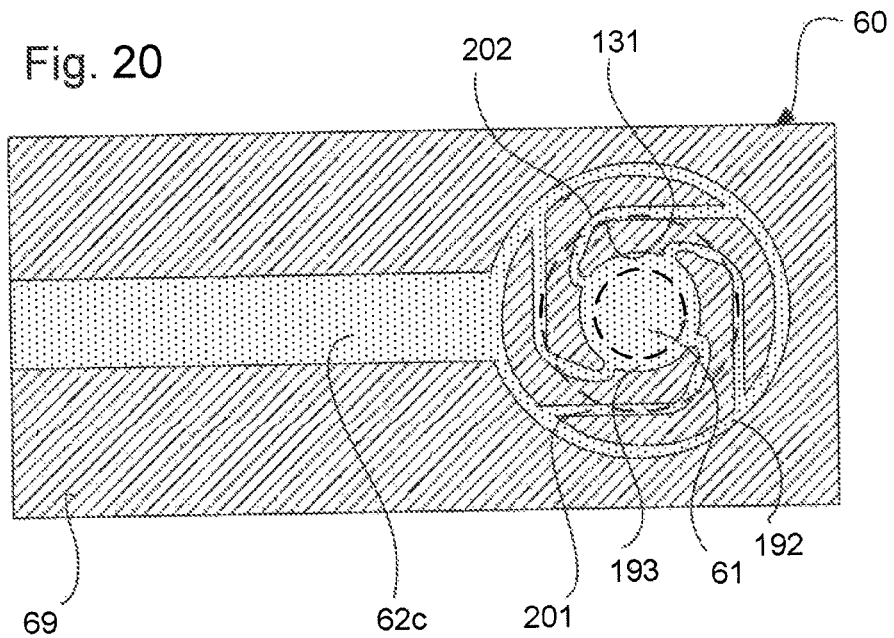
FIG. 20 depicts in plan view an electrical connector 60 according to an embodiment.

In FIGS. 19 to 20, the dashed lines represent the boundary between the high voltage supply pad 61 and the supply pad insulator 68, as well as the boundary between the supply pad insulator 68 and the supply pad shield 66. The solid lines represent the edge of the supply plate 62, namely the boundary between the supply plate 62 and the plate insulator 69.

The spoked wheel reduces the strength of the electrical field at the intersection between the inner edge 131 of the supply pad shield 66 and the edges 132 of the supply plate 62. The spoked wheel portion of the supply plate 62 may comprise a plurality of spokes 191 and an outer rim 192. The supply plate 62 further comprises a high voltage trace 62c.

The width of the high voltage trace 62c may be in the range of from about 1 mm to about 4 mm, preferably within the range of from about 1.5 mm to about 3 mm and preferably about 2 mm. The width of each spoke 191 may be in the range of from about 0.05 mm to about 0.2 mm, preferably in the range of from about 0.075 mm to about 0.15 mm, and preferably about 0.1 mm. The width of the outer rim 192 may be in the range of from about 0.5 mm to about 2 mm, preferably in the range of from about 0.75 mm to about 1.5 mm, and preferably about 1 mm.

In an embodiment, the diameter of the high voltage supply pad 61 is in the range of from about 1 mm to about 4 mm, preferably in the range of from about 1.5 mm to about 3 mm, and preferably about 2 mm. In an embodiment, the spoked wheel portion comprises a central hub 193. Preferably, the central hub 193 is coaxial with the high voltage supply pad 61. Preferably, the high voltage supply pad 61 lies substantially wholly within the central hub 193 of the supply plate 62. In an embodiment, the diameter of the central hub 193 is in the range of from about 2 mm to about 4 mm, and preferably about 3 mm.

In an embodiment, the diameter of the region defined by the inner edge 131 of the supply pad shield 66 is within the range of from about 2 mm to about 6 mm, preferably in the range of from about 3 mm to about 5 mm, and preferably about 4 mm. In an embodiment, the diameter of the outer rim 192 of the supply plate 62 is within the range of from about 3 mm to about 9 mm, preferably within the range of from about 4 mm to about 7 mm, and preferably about 5 mm.

FIG. 20 depicts an embodiment of an electrical connector 60 in plan view. The design of the supply plate 62 of the electrical connector 60 depicted in FIG. 20 is different from described above.

The supply plate 62 comprises a wheel portion having spiralling spokes. The wheel portion of the supply plate 62 may comprise a central hub 193, an outer rim 192 and a plurality of spokes 201. The central hub and the outer rim 192 may be as described above in relation to FIG. 19. The spiralling spokes 201 may have the same width as the spokes 191 described in relation to FIG. 19.

The spiralling spokes 201 of FIG. 20 have an edge 202 that intercepts with the inner edge 131 of the supply pad shield 66 at an oblique angle. Here, an oblique angle is taken to mean an angle that is not 90°. Hence, the angle at the intersection between the edge 202 of the spiralling spokes 201 and the inner edge 131 of the supply pad shield 66 is smaller than the perpendicular angle of FIG. 19.

The purpose of this is to reduce the possibility of electrical breakdown at the intersection between the edges of the supply plate 62 and the inner edge 131 of the supply pad shield 66. It has been observed that electrical breakdown is less likely to occur where this angle is low. In an embodiment, the angle between the edge 132, 202 of the supply plate 62 and the intersecting edge 131 of the supply pad shield 66 (in plan view) is less than about 70°, preferably less than 45°, more preferably less than about 30°, and even more preferably less than about 20°.

Figure 21:
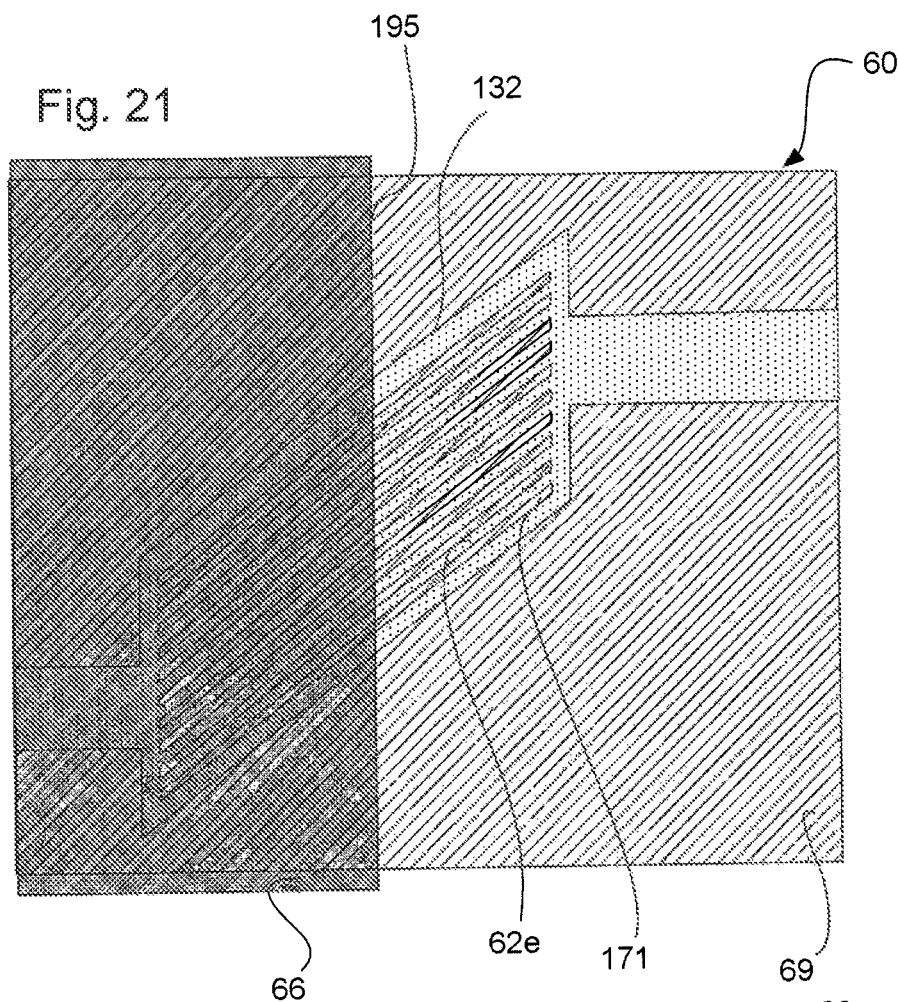
FIG. 21 depicts in plan view an electrical connector 60 according to an embodiment.

FIG. 21 depicts in plan view an electrical connector 60. The shape of the supply plate 62 is similar to the shape of the supply plate depicted in FIG. 17 except that the narrow traces 62d extend at an oblique angle. Accordingly, the angle of interception between the edges 132 of the supply plate and the edge 195 of the grounded plane such as the supply pad shield 66 is oblique.

Preferably, the angle of intersection is less than 70°, more preferably less than 45°, more preferably less than about 30°, and even more preferably less than about 20°. Hence, the supply plate 62 comprises a portion having a grid pattern, wherein edges of the supply plate intersecting an edge 195 of the grounded plane such as the supply pad shield 66 (in plan view) are at an oblique angle to each other.

Figure 22:
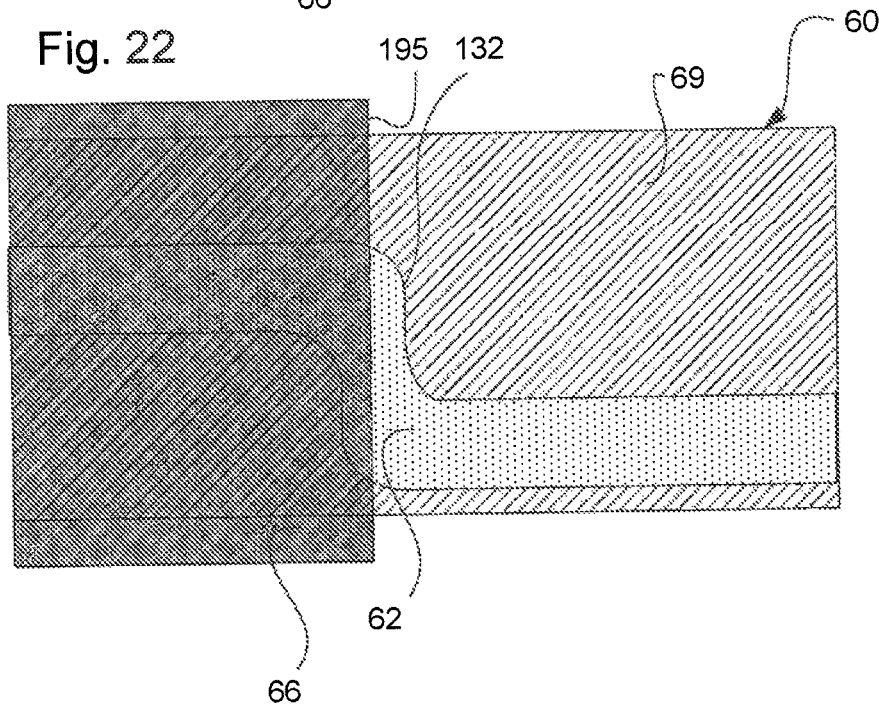
FIG. 22 depicts in plan view an electrical connector 60 according to an embodiment.

FIG. 22 depicts in plan view an electrical connector 60. The supply plate 62 comprises a meander. The meander coincides with where the supply plate 62 crosses the edge 195 of the grounded plane such as the supply pad shield 66. The edge 132 of the supply plate 62 crosses the edge 195 at an oblique angle. In an embodiment the angle is less than or equal to 70°, and preferably approximately 45°.

In an embodiment, the high voltage trace 62c of the supply plate 62 as depicted in FIGS. 17, 18, 21 and/or 22 is connect to a high voltage supply pad 61. In an embodiment, the electrical connector 60 is connected to an electrostatic clamp 80. Where the electrical connector 60 connects to the electrostatic clamp 80, there is a discontinuity in the supply pad shield 66. The edge 195 of the grounded plane such as the supply pad shield 66 crosses the high voltage trace 62c.

What is claimed is:
1. A high voltage electrical connector comprising a laminate that comprises:
an outer shield layer;
an outer insulating layer;
a high voltage supply plate;
an inner insulating layer; and
a high voltage supply pad, wherein the outer insulating layer is configured to be interposed between the outer shield layer and the high voltage supply plate, wherein the inner insulating layer is configured to be interposed between the high voltage supply plate and the high voltage supply pad, wherein the high voltage supply pad is smaller than the high voltage supply plate and lies substantially wholly within the high voltage supply plate when viewed in a direction perpendicular to a plane of the laminate, and wherein the high voltage supply plate is configured to form a region of equipotential that encompasses the high voltage supply pad positioned within the region of equipotential to reduce electrical breakdown.

2. The electrical connector of claim 1, wherein a minimum distance between a perimeter of the high voltage supply plate and a perimeter of the high voltage supply pad when viewed in a direction perpendicular to a plane of the laminate is at least h, 2h, 3h, 4h, or 5h, where h is a minimum distance between the high voltage supply plate and the high voltage supply pad in the direction perpendicular to the plane of the laminate.

3. The electrical connector of claim 1, wherein the high voltage supply plate is configured to comprise a teardrop shape having a substantially circular section larger than the high voltage supply pad such that the high voltage supply pad lies substantially wholly within the substantially circular section when viewed in a direction perpendicular to a plane of the laminate, and is configured to comprise an extended tapered section forming an elongated high voltage trace.

4. The electrical connector of claim 1, wherein the high voltage supply plate is surrounded in a plane of the high voltage supply plate by a dielectric such that the high voltage supply plate is fully surrounded in a cross section of the laminate by the dielectric.

5. The electrical connector of claim 1, wherein the high voltage supply pad is surrounded in a plane of the high voltage supply pad by a pad ground shield that is configured to be connected to electrical ground and wherein the high voltage supply plate is surrounded in a plane of the high voltage supply plate by a plate ground shield that is configured to be connected to electrical ground.

6. The electrical connector of claim 1, further comprising a ground insulating layer configured to cover a pad ground shield that is configured to surround a plane of the high voltage supply pad.

7. The electrical connector of claim 6, wherein a minimum distance between the perimeter of the high voltage supply pad of the connector and the pad ground shield is within a range of about 3h to about 7h, about 4h to about 6h, or about 5h, where h is a minimum distance between the high voltage supply plate and the high voltage supply pad in the direction perpendicular to the plane of the laminate.

8. The electrical connector of claim 1, wherein at least one of the outer insulating layer, the inner insulating layer, and the ground insulating layer comprise polyimide.

\* \* \* \* \*